United States Patent [19]

Morishita

[11] Patent Number: 5,500,550
[45] Date of Patent: Mar. 19, 1996

[54] PHOTOELECTRIC CONVERTING DEVICE

[75] Inventor: Masakazu Morishita, Atsugi, Japan

[73] Assignee: Canon Kabushiki Kaisha, Tokyo, Japan

[21] Appl. No.: 339,287

[22] Filed: Nov. 10, 1994

Related U.S. Application Data

[63] Continuation of Ser. No. 209,376, Mar. 14, 1994, abandoned, which is a continuation of Ser. No. 75,346, Jun. 14, 1993, abandoned, which is a continuation of Ser. No. 627,581, Dec. 14, 1990, abandoned.

[30] Foreign Application Priority Data

Dec. 15, 1989 [JP] Japan .................... 1-324988

[51] Int. Cl.$^6$ .................... H01L 27/14; H01L 31/00
[52] U.S. Cl. .................... 257/461; 257/462; 257/463; 257/464
[58] Field of Search .................... 357/30, 34; 257/463, 257/462, 461, 464, 561, 558

[56] References Cited

U.S. PATENT DOCUMENTS

| | | | |
|---|---|---|---|
| 4,633,287 | 12/1986 | Yamazaki et al. | 357/30 |
| 4,649,409 | 3/1987 | Roppongi et al. | 357/30 |
| 4,814,846 | 3/1989 | Matsumoto et al. | 357/30 |
| 4,879,470 | 11/1989 | Sugawa et al. | 250/578 |
| 4,972,243 | 11/1990 | Sugawa et al. | 357/30 |

FOREIGN PATENT DOCUMENTS

| | | | |
|---|---|---|---|
| 0206649 | 12/1986 | European Pat. Off. | H01L 27/14 |
| 0339386 | 11/1989 | European Pat. Off. | H01L 31/10 |
| 63-263774 | 10/1988 | Japan . | |

OTHER PUBLICATIONS

Allison, J., "Electronic Engineering Semiconductors and Devices", 1990, pp. 178–183.
*Journal of Electronic Engineering,* "Major Properties and Primary Applications of Phototransistors", vol. 19, Sep. 1982, No. 189, Tokyo, Japan, pp. 113–115.

*Primary Examiner*—Donald L. Monin, Jr.
*Attorney, Agent, or Firm*—Fitzpatrick, Cella, Harper & Scinto

[57] ABSTRACT

A photoelectric converting device comprises a first semiconductor area of a first conductivity type, a second semiconductor area of a second conductivity type, and a third semiconductor area of the first conductivity type. A charge is photoelectrically excited by light incident on the second semiconductor area, and is derived from the first semiconductor area after amplification.

A fourth semiconductor area of the first conductivity type is formed in contact with the second semiconductor area and so positioned corresponding to the third semiconductor area. During operation of the device, a depletion layer extending from the interface between the third and fourth semiconductor areas reaches a depletion layer extending from the interface of the third and second semiconductor areas.

27 Claims, 8 Drawing Sheets

PHOTOELECTRIC CONVERTING DEVICE

This application is a continuation of application Ser. No. 08/209,376 filed Mar. 14, 1994, now abandoned, which was a continuation of application Ser. No. 08/075,346, filed Jun. 14, 1993, now abandoned, which was a continuation of application Ser. No. 07/627,581, filed Dec. 14, 1990, now abandoned.

BACKGROUND OF THE INVENTION

1. Field of the Invention

The present invention relates to a photoelectric converting device.

2. Related Background Art

In the conventional art of the photoelectric converting device, there is known for example a device of bipolar transistor type.

Figure 8:
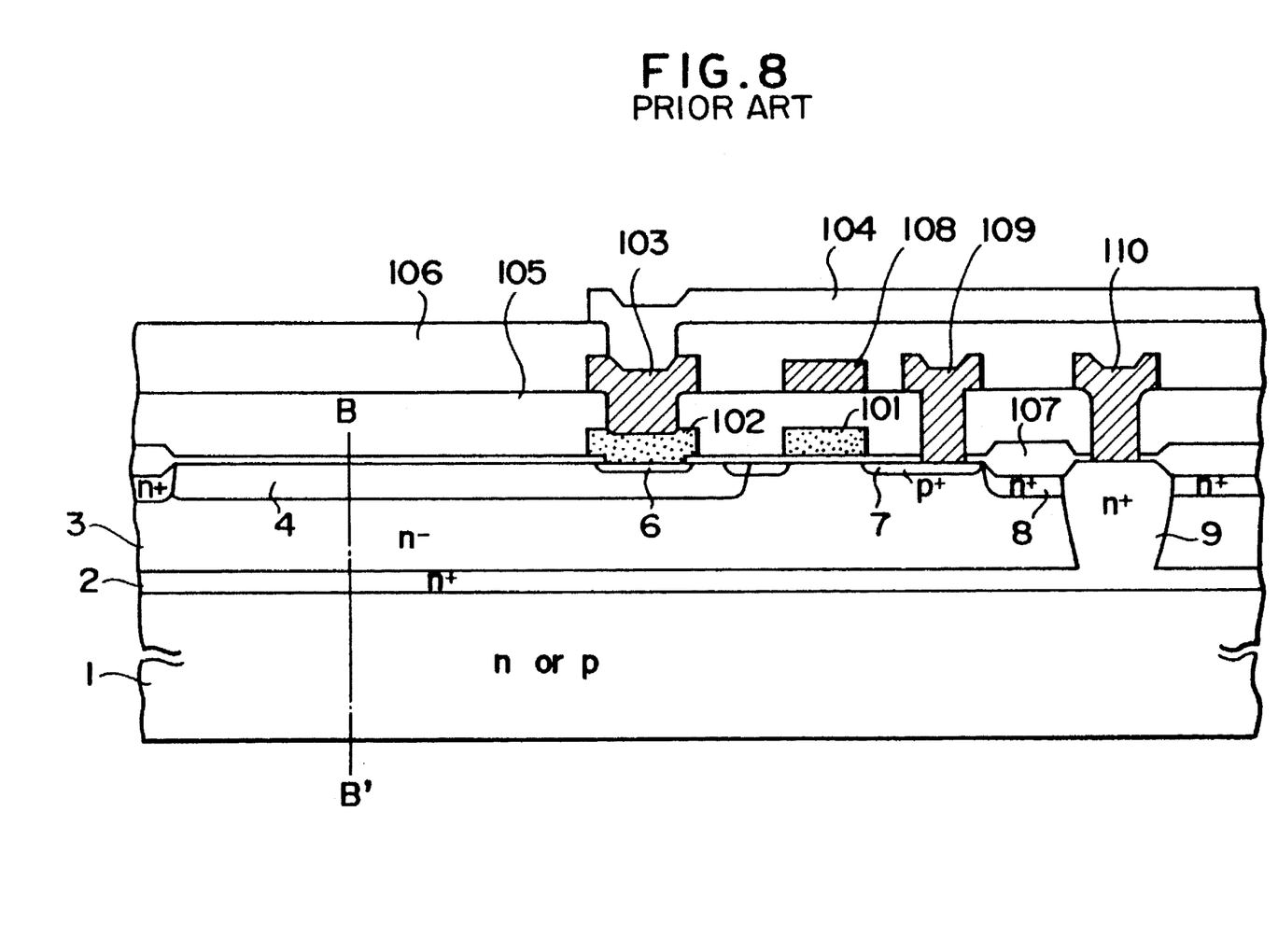
FIG. 8 is a schematic cross-sectional view of an example of the conventional bipolar photoelectric converting device.

FIG. 8 shows, in a schematic cross-sectional view, an example of the conventional bipolar photoelectric converting device, in which there are provided a silicon substrate 1 of type by doping of an impurity such as phosphor (P), antimony (Sb) or arsenic (As) or a p type by doping of an impurity such as boron (B) or aluminum (Al); an $n^+$ area 2 formed for example by an epitaxial process; an n-area 3 of a lower impurity concentration serving as a collector region; a p-area 4 serving as a light receiving base area for accumulating photo generated carries; an $n^+$-area 6 serving as an emitter; and an $p^+$ area 7 serving as a channel stop or connected with the collector.

However, such a conventional photoelectric converting device has been associated with a drawback that the photosensitivity thereof is not always sufficient, and such drawback is more conspicuous in a miniaturized photoelectric converting device.

In the conventional bipolar photoelectric converting device, the photosensitivity can be approximately represented as follows:

$$S_e = \frac{i_p \cdot A_s \cdot t_s}{C_{bc}} \quad (1)$$

wherein $i_p$ is the photoinduced current density per unit area; $A_s$ is the aperture area; $t_s$ is the accumulation time; and $C_{bc}$ is the base-collector capacitance.

As will be apparent from the equation (1), the photosensitivity Se decreases with the increase of the base-collector capacitance $C_{bc}$.

SUMMARY OF THE INVENTION

In consideration of the foregoing, an object of the present invention is to reduce the base-collector capacitance $C_{bc}$ in the above-explained equation (1), thereby improving the photosensitivity of the photoelectric converting device.

Another object of the present invention is to provide a photoelectric converting device provided at least with a first semiconductor area of a first conductive type, a second semiconductor area of a second conductive type, and a third semiconductor area of the first conductive type and adapted to take out the charge, generated by the light irradiating said second semiconductor area, from said first semiconductor area after amplification, comprising:

a fourth semiconductor area of the first conductive type, formed in contact with said second semiconductor area and so positioned to correspond to said third semiconductor area;

wherein, in the operation of said device, a depletion layer extending from the interface between said third and fourth semiconductor areas reaches a depletion layer extending from the interfaces of said third and second semiconductor areas.

Still another object of the present invention is to provide the above-mentioned photoelectric converting device in which the thickness of said fourth semiconductor area is smaller than the penetration distance of blue light and is equal to or less than ½ of the diffusion length of minority carriers in said fourth semiconductor area.

Still another object of the present invention is to provide the above-mentioned photoelectric converting device further comprising a fifth semiconductor layer of the second conductive type, formed on said second semiconductor area and having a higher impurity concentration than in said second semiconductor area, wherein said first semiconductor area is formed on said fifth semiconductor area.

DETAILED DESCRIPTION OF THE PREFERRED EMBODIMENTS

According to the present invention, the above-mentioned fourth semiconductor layer is present and is provided in such a manner that, in the operation of the device, the depletion layer extending from the interface between the third and fourth semiconductor layers reaches the depletion layer extending from the interface between the third and second semiconductor layers, whereby the capacitance of the base area can be diminished to improve the photosensitivity of the device.

Also in the present invention, the loss in sensitivity to radiation having a wavelength of at most 0.53 m such as blue light, resulting from the presence of the fourth semiconductor layer, can be prevented by selecting the thickness of the fourth semiconductor layer in such a manner that the thickness is smaller than the penetration length of blue light and is equal to or less than ½ of the diffusion length of minority carriers in the fourth semiconductor layer.

Also in the present invention, the presence of the area of the second conductive type of a high impurity concentration as explained above allows the impurity concentration of said second semiconductor layer to be determined without affecting the characteristics of the bipolar transistor.

In the following the present invention will be clarified in detail by embodiments thereof shown in the attached drawings.

[First embodiment]

Figure 1A:
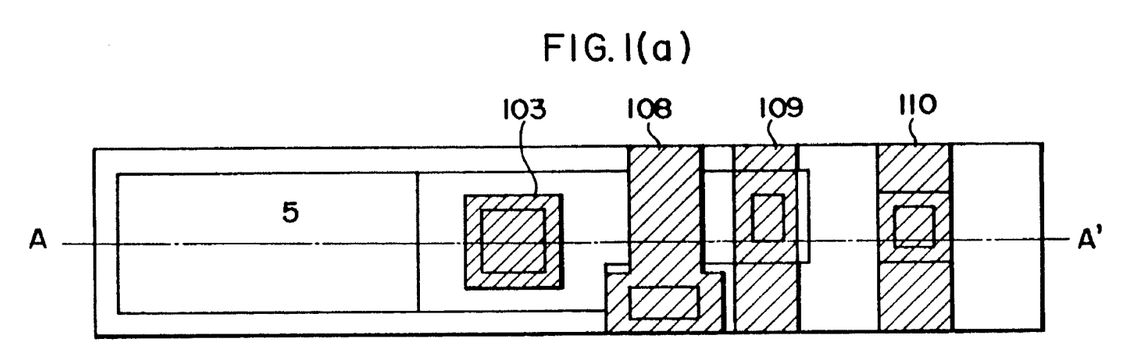
FIG. 1(a) is a schematic plan view of a first embodiment of the photoelectric converting device of the present invention.
Figure 1B:
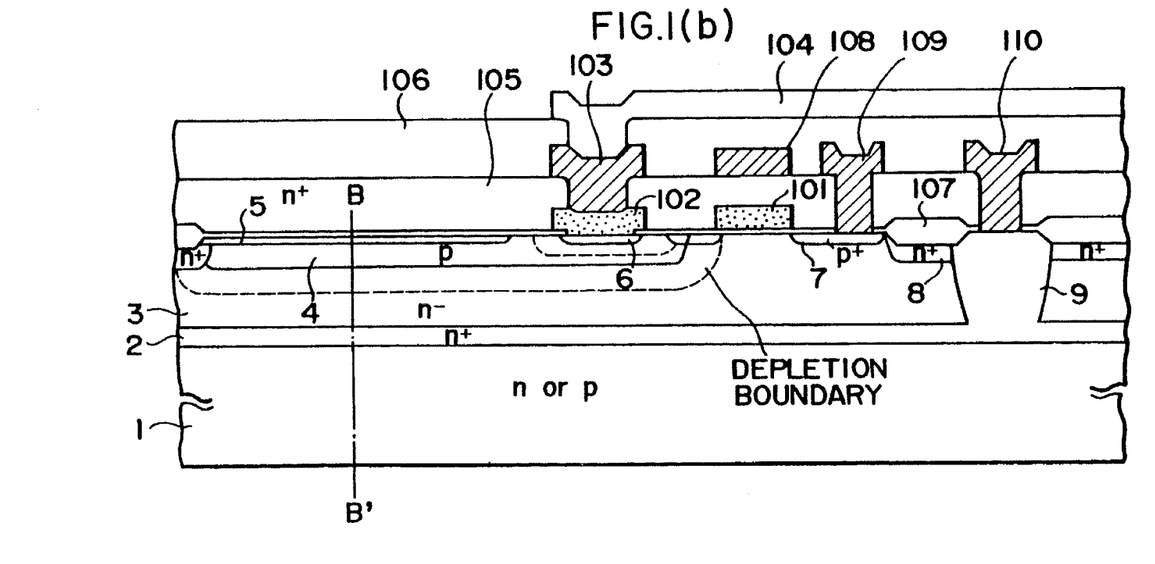
FIG. 1(b) is a schematic cross-sectional view of said first embodiment.

FIGS. 1(a) and 1(b) schematically illustrate a first embodiment of the photoelectric converting device of the present invention, respectively in a plan view of a photoelectric converting cell, and a vertical cross-sectional view along a line A–A' in FIG. 1(a).

As shown in FIGS. 1(a) and 1(b), the photoelectric converting cell comprises:

- a substrate 1 formed as n-type by doping of an impurity such as phosphor (P), antimony (Sb) or arsenic (As), or as p type by doping of an impurity such as boron (B) or aluminum (Al);
- an embedded $n^+$-area 2 formed on said substrate 1;
- an $n^-$-area 3 of a low impurity concentration, formed for example by an epitaxial process on the embedded area 2 and serving as a collector area;
- a $p^-$-area 4 doped with an impurity such as boron (B), serving as a light-receiving area and a base area, and formed on the $n^-$-area 3 for example by impurity diffusion, ion implantation or epitaxial growth;
- an $n^+$-area 5 formed at the surface of the $p^-$-area 4;
- an $n^{30}$-area 6 constituting the emitter of a bipolar transistor;
- a $p^{30}$-area 7 constituting the drain of a MOS transistor;
- an $n^{30}$-area 8 serving as a channel stop and also connected to the collector;
- an $n^{30}$-area 9 for reducing the collector resistance of the bipolar transistor;
- an electrode 101 composed of polysilicon or metal and serving as the gate of the MOS transistor;
- a wiring 108 connected to said electrode 101;
- wirings 102, 103, 104 composed of polysilicon or metal and connected to the emitter of the bipolar transistor;
- a wiring 109 connected to the drain of the MOS transistor;
- an electrode 110 connected to the $n^{30}$-area 9; and
- insulation films 105, 106, 107 for separating the electrodes, wirings and device elements.

For the purpose of simplicity, the insulation films 105, 106, 107 and the wiring 104 are omitted in FIG. 1(a).

Figure 2A:
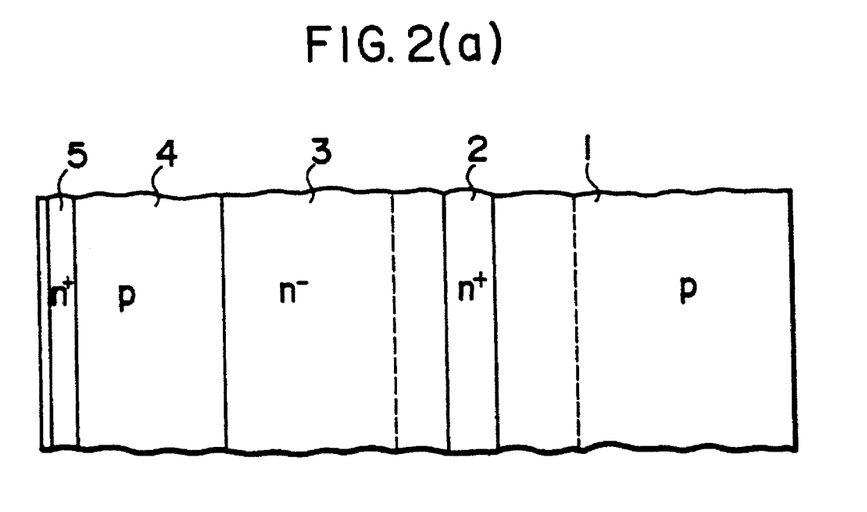
FIG. 2(a) is a magnified view of a portion B–B'in FIG. 1(b)
Figure 2B:
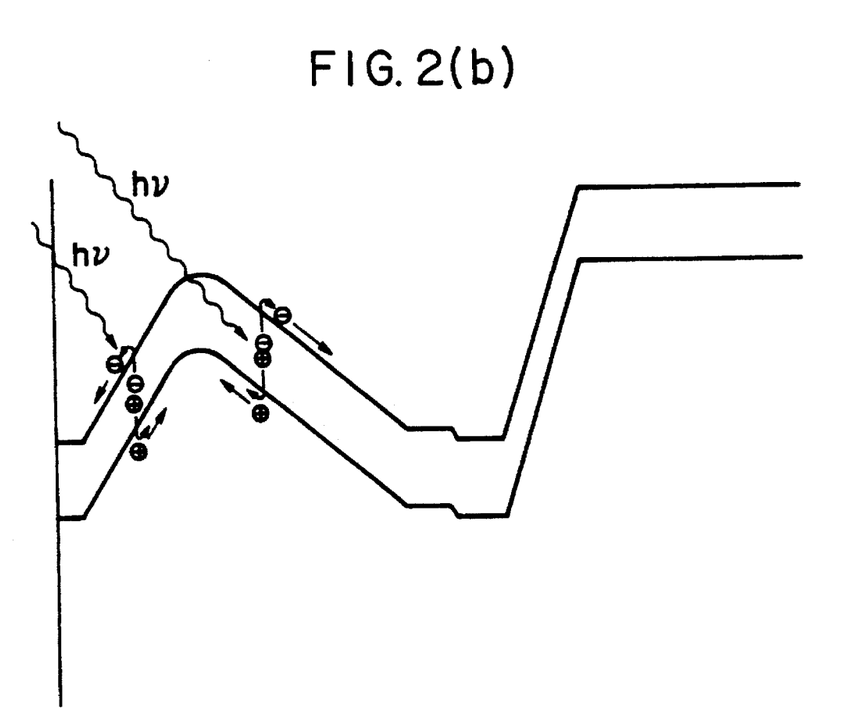
FIG. 2(b) is a potential chart in the direction of depth of FIG. 2(a)

FIG. 2 (a) is a magnified view of a portion B—B' in FIG. 1(b), and FIG. 2 (b) is a potential chart in the direction of depth of FIG. 2 (a).

In the conventional photoelectric converting device, the depletion layer does not completely cover the base area 4, because of the absence of the $n^{30}$-area 5 and because the impurity concentrations at the pn junction between the collector (n–) area 4 and the base (p) area have a relation |p|>|n|. Consequently the surface of the base area 4 is not depleted but contains a neutral area. In practice the complete depletion to the surface is difficult to realize in case the area 4 is used as the base. The complete depletion to the surface, if achieved by a special structure, induces carrier generation at the interface with an insulating material, thus increasing dark current which is a major drawback in the photoelectric converting device.

In the present invention, a surfacial $n^{30}$-area 5 is provided to form an $n^{30}$ p junction, thereby extending the depletion layer also from the surface side, and thus depleting the p-area completely in the direction of depth thereof.

Figure 3:
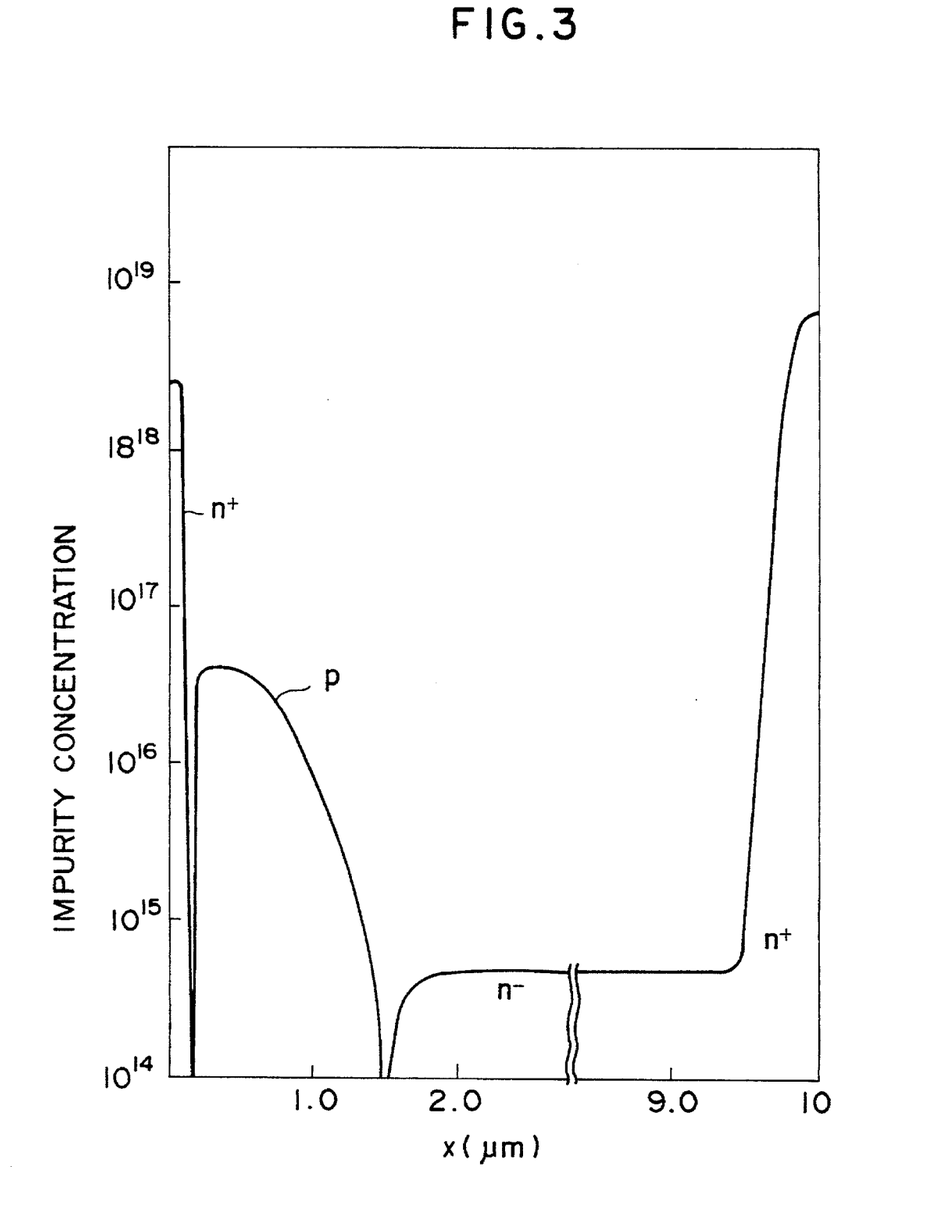
FIG. 3 is a chart showing an example of impurity distribution in the areas shown in FIGS. 2(a) and 2 (b)

FIG. 3 is a chart showing an example of impurity distribution in the areas shown in FIGS. 2(a) and 2(b).

As the p-area 4 is formed by ion implantation followed by thermal treatment or thermal diffusion, the impurity concentration is highest at the surface and gradually decreases with the depth. Consequently, the depletion layer extending from the $n^-$-area enters the p-area 4 but cannot easily reach the upper part of the p-area 4 because the extension has to be done in the increasing direction of impurity concentration. On the other hand, the depletion layer extending from the $n^{30}$-area 5 can easily reach the pn⁻junction because the extension is in the decreasing direction of impurity concentration, so that the p-area 4 can be readily and completely depleted in the entire depth thereof. This phenomenon can explain a fact that the emitter-collector breakdown voltage is high in a normal bipolar transistor but is low in an inverted bipolar transistor in which the emitter and the collector are inverted. The expansion of the depletion layer from the side of $n^{30}$-area is easy, and complete depletion of the p-area can be easily achieved with a voltage not exceeding 5 V.

The depletion of the base area 4 under the $n^{30}$-area 5 drastically reduces the base-collector electrostatic capacitance $C_{bc}$.

Although the entire base area 4 contributes to the capacitance $C_{bc}$ in the conventional structure, the presence of the $n^{30}$-area 5 excludes the capacitance of the p-area 4 corresponding to the area of the $n^+$-area 5 from the capacitance $C_{bc}$, so that the capacitance $C_{bc}$ is almost solely governed by the capacitance around the emitter (see FIG. 1(b)). The capacitance $C_{bc}$ can therefore be easily reduced to ½–1/10 of the conventional value, depending on the pattern design.

Besides the dark current decreases in comparison with that in the conventional structure, because the photogenerated positive holes are not accumulated on the semiconductor surface but in the semiconductor and accumulated by drifting in $C_{bc}$ and $C_{be}$ around the emitter as the result of potential distribution shown in FIG. 2(b), and also because the presence of the $n^{30}$-area at the semiconductor surface avoids the carrier formation at the interface with the insulating material. However, the depletion layer extending from the $n^+$-area has to reach the depletion layer extending from the pn⁻ junction, since, otherwise, the base-collector capacitance becomes larger than in the conventional structure (almost doubled in area).

In the following there will be explained the spectral sensitivity of the photoelectric converting device of the present embodiment.

The spectral photosensitivity can be approximately represented as follows:

$$S(\lambda) = \frac{\lambda}{1.24} \exp(-\alpha \cdot x_d) \times \{1 - \exp(-\alpha \cdot W) \cdot T\} \; [A/W] \quad (2)$$

wherein $\lambda$ is the wavelength of light; $\alpha$ is the absorption coefficient of light (cm$^{-1}$); $x_d$ is thickness of the insensitive area ($n^{30}$-area 5); W is width of the high sensitivity area (depletion layer); and T is the proportion of light entering the semiconductor (transmittance).

As will be understood from the equation (2), the thickness $x_d$ should preferably be as small as possible, because the spectral sensitivity is strongly affected by $x_d$.

In case of silicon, the absorption coefficients for blue ($\lambda=0.45$ μm), green ($\lambda=0.53$ μm) and red ($\lambda=0.65$ μm) are respectively about $2\times10^4$ cm$^{-1}$, $7.5\times10^3$ cm$^{-}$ and $3\times10^3$ cm$^{-1}$. In consideration of a half-peak width of about 0.05 μm for each color, the light absorption in silicon takes place sufficiently at a depth of about 1 μm for blue color, 2 μm for green color and 5 μm for red color. Consequently the blue light is most strongly influenced by the thickness $x_d$ of the neutral area at the semiconductor surface, so that the sensitivity for blue color is deteriorated.

Figure 4:
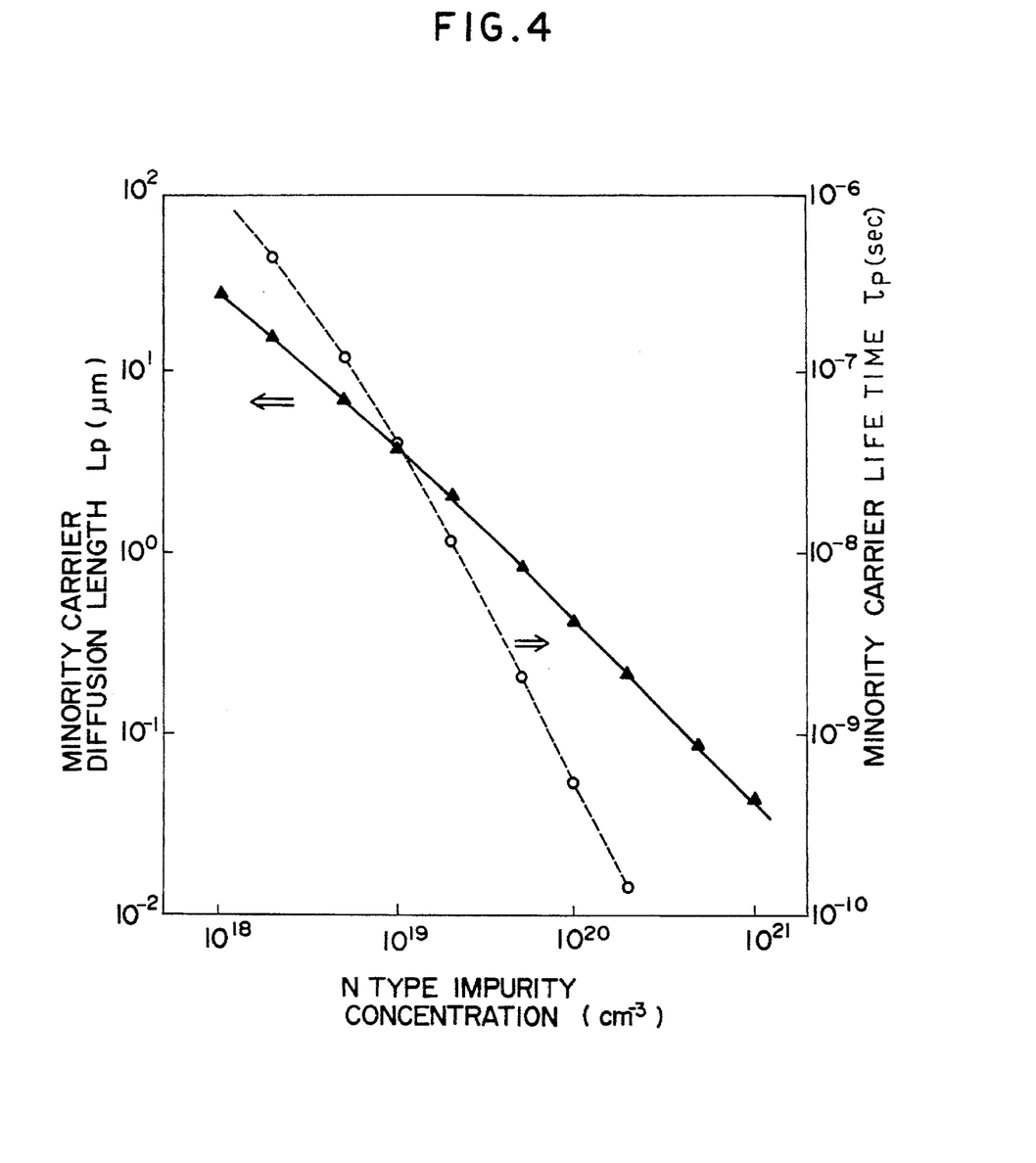
FIG. 4 is a chart showing the relation between the carrier life time and the diffusion length of positive holes in the n-type area.

However, even the n$^{30}$-area is not without light absorption. Nevertheless, the probability of transition is modified to a certain extent because free carriers are already present in the conduction band, and the efficiency is lowered to a certain extent because the minority carriers generated by light absorption partly recombine with the majority carriers in the course of diffusion. FIG. 4 shows the result of calculation on the relation between the carrier life time and the diffusion length for the positive holes in the n-area. For example, for $N=10^{19}$ cm$^{-3}$, there is obtained $L_p$ of about 5 μm, which is considerably long for the diffusion length. Therefore, since the penetration distance ($1/\alpha$) for the blue light in question is about 0.5 μm, the difficulty can be mostly prevented by selecting the thickness of the n$^{30}$-area 5 less than the diffusion distance and not exceeding $1/\alpha$ of $L_p$, namely so as to satisfy a condition:

$$X_< (1/\alpha) \text{ (Blue)}, \tfrac{1}{2} L_p \, (n^{30}) \tag{3}$$

Besides the problem of sensitivity to blue light is alleviated since the photosensitivity is generally improved in comparison with that in the conventional photoelectric converting device, as explained above.

The width of the depletion layer at the n$^{30}$ p junction can be represented in the following manner, in a step junction approximation:

$$W = \left\{ \frac{2 \cdot \epsilon_S}{q} \cdot \frac{N_A + N_D}{N_A \cdot N_D} \cdot (V_{bi} + V_R) \right\}^{1/2} \tag{4}$$

$$V_{Bi} = \frac{kT}{q} \cdot \ln \frac{N_A \cdot N_D}{n_i^2} \tag{5}$$

wherein W is the width of depletion layer; $N_A$ is the impurity density of p$^{-+}$ area; $N_D$ is the impurity density of n$^-$-area; $\epsilon_s$ is the dielectric constant; $n_i$ is the true carrier density; and $V_r$ is the reverse bias voltage. Since $N_D \gg N_A$ in an n$^+$p junction, the abovementioned mentioned equation (4) can be approximated as follows:

$$W \approx \left\{ \frac{2 \cdot \epsilon_S}{q} \cdot \frac{1}{N_A} \cdot (V_{bi} + V_R) \right\}^{1/2} \tag{4'}$$

Figure 5:
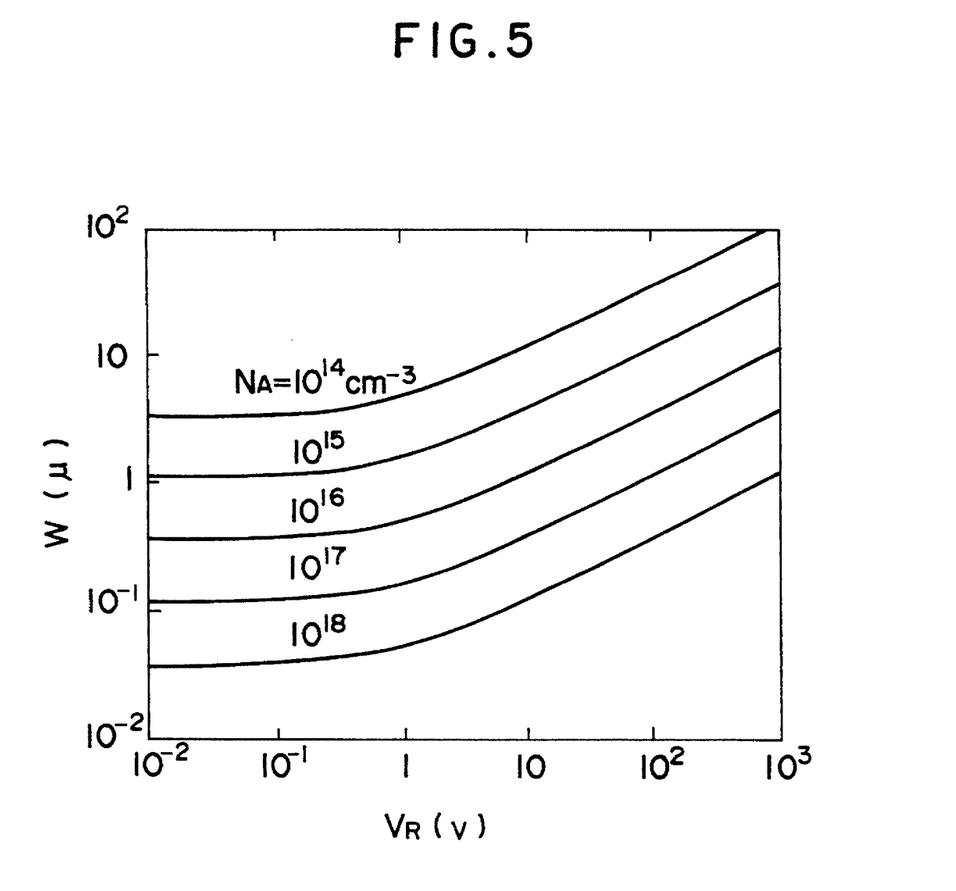
FIG. 5 is a chart showing the relation of $V_R$ and W in silicon, with $N_A$ as parameter.

FIG. 5 is a chart showing the relation between $V_R$ and W in silicon, with $N_A$ as a parameter.

In the ordinary photoelectric converting device in which 5 V is applied to the collector, the effect of the present invention can be obtained by selecting W, corresponding to $N_A$ for $V_R$ of about 3 V, smaller than the thickness of the p-area 4. Stated differently, the thickness of the base area should be selected smaller than W corresponding to the base impurity concentration $N_A$, for a given value of $V_R$. Or, the thickness $x_d$ of the p-area 4 positioned between the n$^{30}$-area 5 and the n$^-$-area 3 should be selected smaller than W determined by $N_A$ and $V_R$.

[Second embodiment]

Figure 6A:
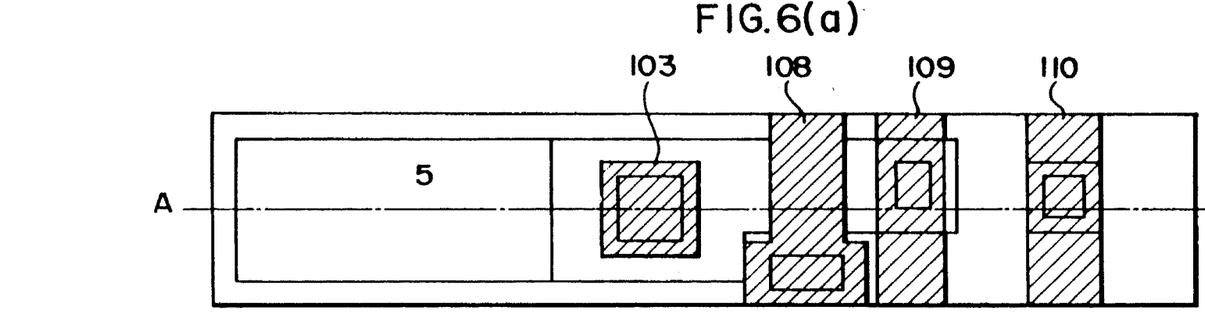
FIG. 6(a) is a schematic plan view of a second embodiment of the photoelectric converting device of the present invention.
Figure 6B:
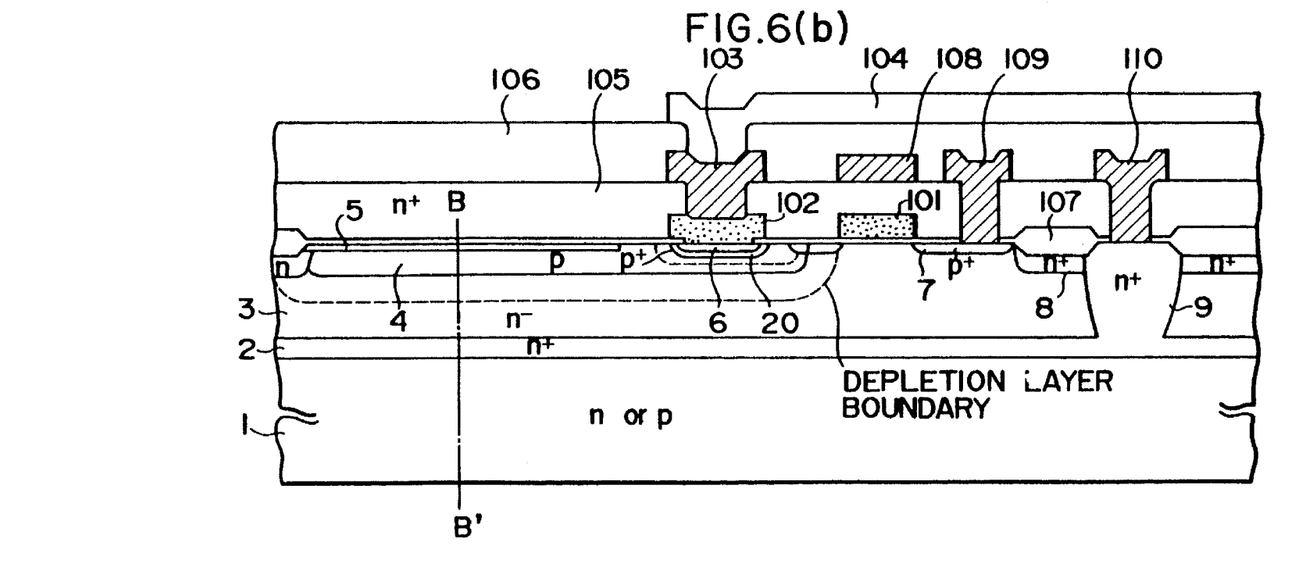
FIG. 6(b) is a schematic cross-sectional view of the second embodiment.

FIGS. 6(a) and 6(b) illustrate a second embodiment of the photoelectric converting device of the present invention, respectively in a plan view and in a vertical cross-sectional view along a line A–A' in FIG. 6(a).

Different from the device of the foregoing first embodiment, the device of the present embodiment is provided with a p$^{30}$-area 20 only below the emitter area 6. The presence of the p$^{30}$-area 20 provides an advantage that the impurity concentration of the p-area can be arbitrarily determined, without being influenced by the characteristics of the bipolar transistor.

Such photoelectric converting device showed, in an operation test, a remarkable improvement in the photosensitivity, in comparison with the conventional device.

[Third embodiment]

Figure 7A:
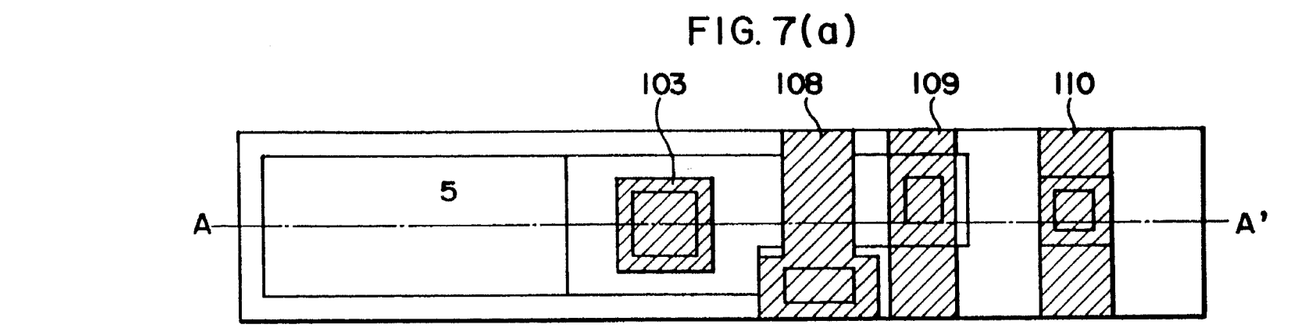
FIG. 7(a) is a schematic plan view of a third embodiment of the photoelectric converting device of the present invention.
Figure 7B:
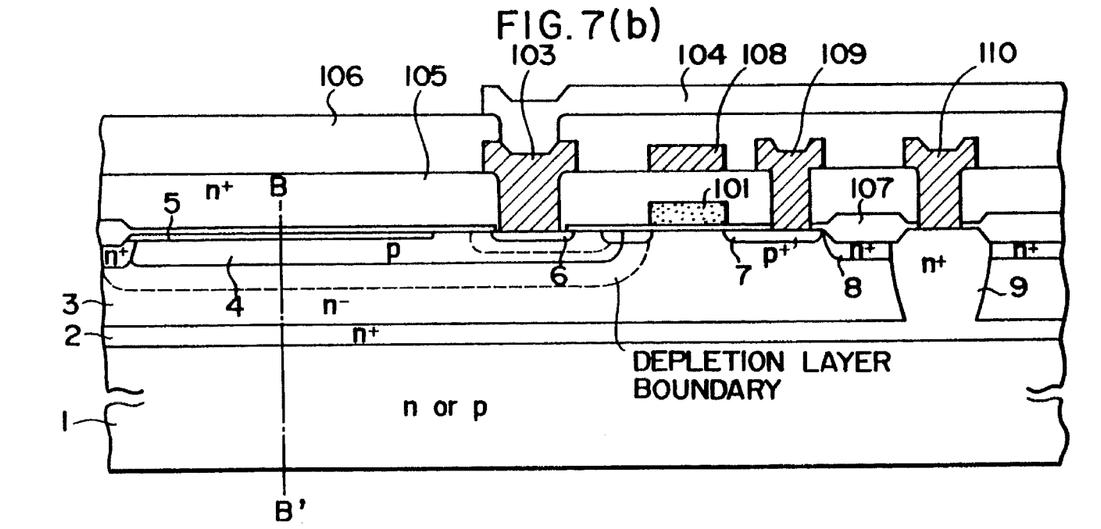
FIG. 7(b) is a schematic cross-sectional view of the third embodiment.

FIGS. 7(a) and 7(b) illustrate a third embodiment of the photoelectric converting device of the present invention, respectively in a plan view of a photoelectric converting cell and in a vertical cross-sectional view along a line A–A' in FIG. 7(a).

In the structure shown in FIGS. 7(a) and 7(b), the lead wire from the emitter electrode 103 is taken out directly, without the polysilicon layer 102. Also a barrier metal or the like may be made present between the layers 103 and 6.

Such photoelectric converting device showed, in an operation test, a remarkably improved photosensitivity, in comparison with the conventional device.

The foregoing first to third embodiments have been limited to the application of the present invention to a line sensor, but similar effects can naturally be obtained in the applications to other photoelectric conversion devices, for example area sensors.

As detailedly explained in the foregoing, the present invention allows the base-collector capacitance $C_{bc}$ of the bipolar transistor to be drastically reduced thereby remarkably improving the photosensitivity of the photoelectric converting device.

Also according to the present invention, the presence of a surficial n$^+$-area of high impurity concentration reduces the current generated at the interface between SiO$_2$ and Si, whereby the dark current is reduced to decrease the noise and to significantly improve the S/N ratio. Also the dynamic range is widened so that the signal can be obtained down to a low irradiation level.

I claim:

1. A photoelectric converting device of a bipolar transistor type comprising:

a first semiconductor area of a first conductivity type;

a second semiconductor area of a second conductivity type, wherein said first semiconductor area takes out charges, formed by light irradiation on said second semiconductor area, after amplification;

a third semiconductor area of the first conductivity type; and a fourth semiconductor area of the first conductivity type, arranged in contact with said second semiconductor area, at a light incident side, but not in contact with said first semiconductor area, and positioned corresponding to said third semiconductor area, wherein said second semiconductor region is sandwiched between said third and fourth semiconductor areas, wherein said fourth semiconductor area is arranged such that, in operation of said device, a depletion layer extending from an interface between said second and fourth semiconductor areas reaches a depletion layer extending from an interface of said third and second semiconductor areas, and wherein said third semiconductor region is in an electrical contact with said fourth semiconductor region and said first semiconductor region is not in electrical contact with said fourth semiconductor region.

2. A photoelectric converting device according to claim 1, wherein a thickness of said fourth semiconductor area is smaller than the penetration distance of the light having a wavelength of at most 0.53 µm and is equal to or less than a diffusion length of minority carriers in said fourth semiconductor area.

3. A photoelectric converting device according to claim 1, further comprising a fifth semiconductor area of the second conductivity type, arranged on said second semiconductor area and having a higher impurity concentration than in said second semiconductor area, wherein said first semiconductor area is arranged in contact with a portion of said fifth semiconductor area.

4. A photoelectric converting device according to claim 2, further comprising a fifth semiconductor layer of the second conductivity type, arranged on said second semiconductor area and having a higher impurity concentration than in said second semiconductor area, wherein said first semiconductor area is arranged on said fifth semiconductor area.

5. A photoelectric converting device according to claim 2, wherein the irradiating light comprises blue light.

6. A photoelectric converting device according to claim 2, whrein the irradiating light has a wavelength of at most 0.45 µm.

7. A device according to claim 1, wherein said third and fourth semiconductor areas are maintained at the same potential.

8. A device according to claim 1, further comprising a sixth semiconductor area of the first conductivity type arranged in contact with said third and fourth semiconductor areas.

9. A device according to claim 8, wherein said sixth semiconductor area includes an impurity with a concentration higher than that of said third semiconductor area.

10. A device according to claim 1, wherein said first conductivity type is N-type, and said second conductivity type is P-type.

11. A device according to claim 1, wherein said first, second and third semiconductor areas are emitter, base and collector regions, respectively.

12. A device according to claim 1, further comprising an insulating layer on said fourth semiconductor area.

13. A device according to claim 1, further comprising an MOS transistor having a source region, wherein a portion of said source region of said MOS transistor consitutes said second semiconductor region.

14. A device according to claim 1, wherein a junction between said fourth and second semiconductor regions is reverse-biased during operation of said device.

15. A photoelectric converting device according to claim 1, where
a reverse biasing is applied between said third semiconductor regions and said second semiconductor region, and also between said second semiconductor region and said fourth semiconductor region, respectively.

16. A photoelectric converting device of a bipolar transistor type comprising:

an emitter area of a first conductivity type;

a base area of a second conductivity type;

a collector area of a first conductivity type; and a semiconductor area arranged in contact with said base area at a light incident side, without contacting with said emitter area, and electrically connected to said collector area, wherein said semiconductor area is arranged so that a depletion layer extending from an interface between said base area and said semiconductor area at driving of said device reaches a depletion layer extending from an interface between said collector and base areas.

17. A device according to claim 16, wherein said semiconductor areas has a thickness at most not greater than a distance to which an incident light of a wirelength 0.53 µm, but not smaller than a carrier diffusion length.

18. A device according to claim 16, further comprising a second base area having an impunity concentration higher than that of said base region, and being provided between said base and emitter area.

19. A device according to claim 18, further comprising a second base area having an impunity concentration higher than that of said base region, and being provided between said base area and emitter area.

20. A device according to claim 17, wherein said incident light is a blue colored light.

21. A device according to claim 17, wherein said incident light has a wave length at most not greater than 0.45 µm.

22. A device according to claim 16, wherein said collector area and said semiconductor area are maintained at the same potential.

23. A device according to claim 16, further comprising:

a channel stop of the first conductivity type arranged adjacent to said collector area and to said semiconductor area.

24. A device according to claim 23, wherein said channel stop has an impunity concentration higher than that of said collector region.

25. A device according to claim 16, wherein said first conductivity type is n-type, and said second conductivity type is p-type.

26. A device according to claim 16, further comprising an insulating layer on said semiconductor area.

27. A device according to claim 16, further comprising a MOS transistor, wherein a part of a source of said MOS transistor is electrically connected to said base region.

* * * * *

UNITED STATES PATENT AND TRADEMARK OFFICE
CERTIFICATE OF CORRECTION

PATENT NO. : 5,500,550
DATED : March 19, 1996
INVENTOR(S) : MASAKAZU MORISHITA

It is certified that error appears in the above-identified patent and that said Letters Patent is hereby corrected as shown below:

COLUMN 1

Line 22, "of type" should read --of n type--.
Line 23, "a" should read --as--.
Line 28, "carries;" should read --carriers;--.
Line 29, "p$^+$area" should read --p$^+$-area--.
Line 35, "miniatuarized" should read --miniaturized--.

COLUMN 3

Line 36, "n$^{30}$-area" should read --n$^+$-area--.
Line 38, "p$^{30}$-area" should read p$^+$-area--.
Line 40, "n$^{30}$-area" should read --n$^+$-area--.
Line 42, "n$^{30}$-area" should read --n$^+$-area--.
Line 51, "n$^{30}$-area" should read --n$^+$-area--.
Line 61, "n$^{30}$-area" should read --n$^+$-area--.

COLUMN 4

Line 5, "n$^{30}$-area" should read --n$^+$-area--.
Line 6, "n$^{30}$p" should read --n$^+$p--.
Line 18, "n$^{30}$-area" should read --n$^+$-area--.
Line 26, "n$^{30}$-area" should read --n$^+$-area--.
Line 28, "n$^{30}$-area" should read --n$^+$-area--.
Line 33, "n$^{30}$-area" should read --n$^+$-area--.
Line 45, "n$^{30}$-area" should read --n$^+$-area--.
Line 62, "n$^{30}$-area" should read --n$^+$-area--.

UNITED STATES PATENT AND TRADEMARK OFFICE
CERTIFICATE OF CORRECTION

PATENT NO. : 5,500,550
DATED : March 19, 1996
INVENTOR(S) : MASAKAZU MORISHITA

It is certified that error appears in the above-identified patent and that said Letters Patent is hereby corrected as shown below:

COLUMN 5

Line 3, "$2 \times 10^4$ cm$^-$1, $7.5 \times 10^3$ cm$^-$" should read --$2 \times 10^4$ cm$^{-1}$, $7.5 \times 10^3$ cm$^{-1}$--.
Line 10, "$n^{30}$-area" should read --$n^+$-area--.
Line 23, "$n^{30}$-area" should read --$n^+$-area--.
Line 27, "$x_{<(}1/\alpha)$(Blue), $\frac{1}{2}L_p(n^{30})$" should read --$xd<(1/\alpha)$(Blue), $\frac{1}{2}L_p(n^+)$--.
Line 33, "$n^{30}p$" should read --$n^+p$
Line 43, "$p^{-+}$area;" should read --$p^-$-area;--.
Line 47, "mentioned" should be deleted.
Line 60, "$n^{30}$-area" should read --$n^+$-area--.

COLUMN 6

Line 3, "$p^{30}$-area" should read --$p^+$-area--.
Line 4, "$p^{30}$-area" should read --$p^+$-area--.

COLUMN 7

Line 53, "where" should read --wherein--.

UNITED STATES PATENT AND TRADEMARK OFFICE
CERTIFICATE OF CORRECTION

PATENT NO. : 5,500,550
DATED : March 19, 1996
INVENTOR(S) : MASAKAZU MORISHITA

It is certified that error appears in the above-identified patent and that said Letters Patent is hereby corrected as shown below:

COLUMN 8

```
Line 17, "areas" should read --area--.
Line 20, "wirelength" should read --wavelength--.
Line 23, "impunity" should read --impurity--.
Line 45, "impunity" should read --impurity--.
```

Signed and Sealed this

Tenth Day of September, 1996

*Attest:*

BRUCE LEHMAN

*Attesting Officer*     *Commissioner of Patents and Trademarks*